US009362112B2

(12) United States Patent
Wieber et al.

(10) Patent No.: US 9,362,112 B2
(45) Date of Patent: Jun. 7, 2016

(54) P-DOPED SILICON LAYERS

(75) Inventors: Stephan Wieber, Karlsruhe (DE); Matthias Patz, Bottrop (DE); Harald Stueger, Graz (AT); Jasmin Lehmkuhl, Haltern am See (DE)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 13/819,376

(22) PCT Filed: Aug. 19, 2011

(86) PCT No.: PCT/EP2011/064279
§ 371 (c)(1),
(2), (4) Date: Feb. 27, 2013

(87) PCT Pub. No.: WO2012/028476
PCT Pub. Date: Mar. 8, 2012

(65) Prior Publication Data
US 2013/0168824 A1    Jul. 4, 2013

(30) Foreign Application Priority Data
Sep. 3, 2010  (DE) .......................... 10 2010 040 231

(51) Int. Cl.
| H01L 21/20 | (2006.01) |
| H01L 21/36 | (2006.01) |
| H01L 21/02 | (2006.01) |
| C23C 18/12 | (2006.01) |
| C23C 18/14 | (2006.01) |
| H01L 21/228 | (2006.01) |
| H01L 31/068 | (2012.01) |
| H01L 31/18 | (2006.01) |
| H01L 29/16 | (2006.01) |

(52) U.S. Cl.
CPC ........ *H01L 21/02381* (2013.01); *C23C 18/122* (2013.01); *C23C 18/1204* (2013.01); *C23C 18/1225* (2013.01); *C23C 18/14* (2013.01); *H01L 21/0237* (2013.01); *H01L 21/0262* (2013.01); *H01L 21/02532* (2013.01); *H01L 21/02579* (2013.01); *H01L 21/02628* (2013.01); *H01L 21/228* (2013.01); *H01L 29/16* (2013.01); *H01L 31/068* (2013.01); *H01L 31/1804* (2013.01); *Y02E 10/547* (2013.01); *Y02P 70/521* (2015.11)

(58) Field of Classification Search
CPC .... H01L 31/00; H01L 25/00; H01L 21/02381
USPC .................... 257/607; 438/478, 57
See application file for complete search history.

(56) References Cited

U.S. PATENT DOCUMENTS

| 4,490,192 | A * | 12/1984 | Gupta ..................... C30B 31/02 106/204.3 |
| 6,527,847 | B1 * | 3/2003 | Matsuki ................... C09D 1/00 106/285 |
| 6,541,354 | B1 * | 4/2003 | Shimoda ................... C30B 7/00 257/E21.114 |
| 7,314,513 | B1 * | 1/2008 | Zurcher ............ H01L 21/02532 106/287.14 |
| 7,674,926 | B1 * | 3/2010 | Guo ...................... C07F 9/5004 556/19 |
| 7,981,482 | B1 | 7/2011 | Zuercher et al. |
| 2003/0045632 | A1 | 3/2003 | Shiho et al. |
| 2003/0148024 | A1 * | 8/2003 | Kodas ..................... C23C 18/06 427/125 |
| 2003/0229190 | A1 * | 12/2003 | Aoki ....................... C01B 33/04 526/279 |
| 2005/0176183 | A1 * | 8/2005 | Aoki ................... H01L 27/1292 438/149 |
| 2006/0063394 | A1 * | 3/2006 | McSwiney .............. C23C 16/22 438/783 |
| 2006/0185712 | A1 * | 8/2006 | Shiho ................... C23C 18/1212 136/243 |
| 2008/0022897 | A1 | 1/2008 | Zurcher et al. |
| 2008/0160265 | A1 * | 7/2008 | Hieslmair .............. B82Y 30/00 428/208 |
| 2008/0160733 | A1 | 7/2008 | Hieslmair et al. |
| 2009/0203197 | A1 * | 8/2009 | Hanawa ........... C23C 16/45536 438/513 |
| 2011/0108777 | A1 * | 5/2011 | Schulz .................... C01B 33/04 252/519.14 |
| 2011/0109688 | A1 | 5/2011 | Hieslmair et al. |
| 2011/0178321 | A1 * | 7/2011 | Guo ...................... C07F 7/0896 556/406 |
| 2011/0189072 | A1 | 8/2011 | Brausch et al. |
| 2011/0268642 | A1 | 11/2011 | Brausch et al. |
| 2012/0061679 | A1 * | 3/2012 | Karshtedt ............. C08G 77/60 257/75 |

(Continued)

FOREIGN PATENT DOCUMENTS

| EP | 0 130311 | 1/1985 |
| EP | 1 284 306 | 2/2003 |

(Continued)

OTHER PUBLICATIONS

International Search Report Issued Nov. 23, 2011 in PCT/EP11/64279 Filed Aug. 19, 2011.
U.S. Appl. No. 14/435,528, filed Apr. 14, 2015, Traut, et al.

*Primary Examiner* — Amar Movva
*Assistant Examiner* — Sheikh Maruf
(74) *Attorney, Agent, or Firm* — Oblon, McClelland, Maier & Neustadt, L.L.P.

(57) ABSTRACT

The invention relates to a process for producing p-doped silicon layers, especially those silicon layers which are produced from liquid silane-containing formulations. The invention further relates to a substrate coated with a p-doped silicon layer. The invention additionally relates to the use of particular dopants based on boron compounds for p-doping of a silicon layer.

18 Claims, No Drawings

(56) References Cited

U.S. PATENT DOCUMENTS

| | | | |
|---|---|---|---|
| 2012/0205654 A1* | 8/2012 | Stuetzel | C23C 18/1204 257/52 |
| 2012/0214005 A1 | 8/2012 | Wieber et al. | |
| 2012/0263639 A1 | 10/2012 | Brausch et al. | |
| 2012/0273805 A1 | 11/2012 | Wieber et al. | |
| 2012/0291665 A1 | 11/2012 | Wieber et al. | |
| 2012/0294791 A1* | 11/2012 | Elangovan | C01B 33/04 423/347 |
| 2012/0318662 A1* | 12/2012 | Furusho | H01L 21/0242 204/178 |
| 2013/0168824 A1 | 7/2013 | Wieber et al. | |

FOREIGN PATENT DOCUMENTS

| | | |
|---|---|---|
| EP | 2501840 A2 * | 9/2012 |
| JP | 2006-156582 A | 6/2006 |
| JP | 2007-22959 A | 2/2007 |
| WO | 2012 028476 | 3/2012 |
| WO | 2012 041837 | 4/2012 |
| WO | 2012 055693 | 5/2012 |
| WO | 2012 072401 | 6/2012 |
| WO | 2012 072403 | 6/2012 |
| WO | 2012 072406 | 6/2012 |
| WO | 2012 080003 | 6/2012 |
| WO | 2012 084897 | 6/2012 |
| WO | 2012 130620 | 10/2012 |

* cited by examiner

P-DOPED SILICON LAYERS

The invention relates to a process for producing p-doped silicon layers, especially those silicon layers which are produced from liquid silane-containing formulations. The invention further relates to a substrate coated with a p-doped silicon layer. The invention additionally relates to the use of particular dopants based on boron compounds for p-doping of a silicon layer.

The synthesis of silicon layers is of great significance for the semiconductor industry, especially for the production of electronic or optoelectronic component layers, for example for use in solar cells, photodiodes and transistors.

The production of solar cells requires semiconductor layers with different doping. By deposition of one or more silicon layers on a suitable substrate, it is possible to produce one or more p-n junctions or pin or nip junctions, which act as solar cells. The deposition is effected by means of an application device suitable for thin layers, for example a roll to roll coater. The layers formed are stabilized by a suitable thermal treatment, such that they typically assume a mixture of microcrystalline, nanocrystalline and amorphous structures. Unless stated explicitly, all microcrystalline, nanocrystalline and/or amorphous layers shall be referred to here generally as "converted Si layers", since an exact distinction and definition is not readily possible in most cases or is of minor importance for the result achieved.

It is possible in principle to produce p-doped silicon layers via various processes. Among these, however, CVD techniques have the disadvantage that they have to be performed under high vacuum. Processes based on gas phase depositions have the further disadvantage that they require i) the use of very high temperatures in the case of a thermal reaction regime or ii) high energy densities in the case of introduction of the energy required for the decomposition of the precursor in the form of electromagnetic radiation. In both cases, it is possible only with a very high level of apparatus complexity to introduce the energy required to decompose the precursor in a controlled and homogeneous manner. Since the other processes for production of p-doped silicon layers are also disadvantageous, p-doped silicon layers are thus preferably formed via depositions from the liquid phase.

In such liquid phase processes for production of p-doped silicon layers, liquid reactants or solutions containing solid or liquid reactants, a dopant and optionally further additives are applied to the substrate to be coated and then converted thermally and/or with electromagnetic radiation to a p-doped silicon layer.

Reactants usable with preference are hydridosilanes, and boron compounds as dopants. The hydridosilanes consist essentially of silicon and hydrogen atoms and have the advantage that they react on conversion to give deposited silicon and gaseous hydrogen. The deposited silicon may still contain a residual hydrogen content beneficial for the electronic properties. The boron compounds consist essentially of boron atoms and hydrocarbyl radicals or hydrogen atoms.

The prior art includes in particular liquid phase processes for production of p-doped silicon layers from liquid H-silanes by addition of main group III element compounds or from heteroatomic cyclic silane compounds of the $Si_aX_bY_c$ type.

U.S. Pat. No. 5,866,471 A describes, inter alia, the use of linear or cyclic hydridosilanes and silyl group-substituted linear or cyclic hydridosilanes, which can be decomposed thermally in the presence of a dopant to give an n-type or p-type semiconductor film. The substances mentioned are solid at room temperature and soluble in organic solvents, and preferably have a degree of polymerization of 3 to 10 000, preferably 5 to 30. They are additionally preferably decomposed thermally between 200 and 700° C., the curing times being in the range from 10 minutes to 10 hours.

EP 1 085 579 A1 describes processes for production of solar cells, in which liquid compositions containing silanes are used and are converted by heat, light and/or laser treatment. The liquid coating compositions may contain a solvent and a cyclic silicon compound of the formula $Si_nX_m$ (X=H, Hal, n≥5, m=n, 2n−n, 2n) and/or a modified silane compound of the formula $Si_aX_bY_c$ (X=H, Hal, Y=B, P, a≥3, c=1 to a and b=a to 2a+c+2). The conversion of the liquid compositions to a p-doped Si layer or other layer can be effected by means of a conversion step which follows a drying step. A typical drying temperature specified is a range from 100 to 200° C. Here too, it is stated that a significant conversion to silicon layers results only from 300° C., that an amorphous layer results in the range from 300° C. to 550° C., and that polycrystalline layers result from 550° C.

EP 1 357 154 A1 describes compositions of "higher silanes" containing a polysilane preparable by irradiating a photopolymerizable silane with UV radiation. The photopolymerizable silane may be a silane of the generic formula $Si_nX_m$ (where n≥3, m≥4, X=H, Hal); compounds specified by way of example are cyclic silanes of the formula $Si_nX_{2n}$, bi- or polycyclic structures of the formula $Si_nH_{2n-2}$ and other silanes with a cyclic structure in the molecule, which exhibit extremely high reactivity to light and photopolymerize efficiently. The compositions of the "higher silane" can be converted to a silicon film on a substrate by thermal decomposition or photo decomposition. In this case, main group III or V element compounds are used before or after the polymerization. For this purpose, the moist film is dried by heat (typically 100 to 200° C.) and then converted by heat and/or light. Amorphous films can be obtained by thermal treatment at temperatures of less than 550°; the result at higher temperatures is polycrystalline films. The examples report conversion times of 10 minutes (350° C., 400° C., 500° C.), and the dopant substances $PH_3$, $P_4$, $B_5H_9$, $H_{10}H_{14}$. Disadvantages here are long conversion times due to stable clusters, and the toxicity thereof. A high stability of boron atom clusters complicates homogeneous distribution of the boron, and so a relatively high addition of boron is necessary (10 at % of boron).

EP 1640342 A1 describes compositions of "higher silanes" containing a polysilane which, by GPC, has mean molecular weight in the range from 800 to 5000 g/mol. This composition may also contain an element of main group 3 or 5. In the example, cyclopentasilane is irradiated with decaborane. The film is cured at 400° C. for 30 min and then at 800° C. for 5 min. Disadvantages here are long conversion times due to stable clusters, and the toxicity thereof. The high stability of boron atom clusters complicates homogeneous distribution of the boron.

US 2008022897 A1 describes the use of a wide variety of different dopants. The claims describe merely compositions, but not a process description which leads to n- or p-type Si layers. Claim 1 describes the composition of $Si_nH_{2n+2}$ where n=3 to 20 and a $BR_3$ in which each R may independently be H, alkyl, etc.

JP2002100576 A1 describes the use of a $BH_3$ sulphide complex as a dopant. The complex and the hydridosilane are pyrolyzed and co-deposited on a substrate by means of a suitable inert organic medium in the vapour phase. The examples report deposition temperatures of 400° C. and conversion time of at least 20 min.

However, a common factor to all these processes which have been described is that they require very long curing times in order to activate the chemically very stable dopants used in the Si layer.

It is thus an object of the present invention to provide a process for producing p-doped silicon layers which avoids the cited disadvantages of the prior art. More particularly, the process shall be based on the deposition of liquid silane formulations. In addition, a liquid phase process for producing p-doped silicon layers shall be provided, in which the formulations used are stable and wet the substrate efficiently, and which leads to homogeneous p-doped silicon layers with homogeneous distribution of doping. It would also be particularly advantageous to be able to produce p-doped aSi layers with good conductivities.

The abovementioned object is achieved in accordance with the invention by a process for producing at least one p-doped silicon layer arranged on a substrate, comprising the steps of:
a) providing a substrate,
b) providing a formulation containing at least one silicon compound and, as a dopant, at least one compound from the group of the hydroborating agents,
c) applying the formulation to the substrate,
d) irradiating and/or thermally treating the coated substrate, to form a p-doped layer consisting predominantly of silicon.

Hydroborating agents in the context of the present invention are understood to mean boron compounds having at least one boron-hydrogen bond, excluding diborane. Diborane is excluded from the suitable hydroborating agents in the context of the present invention since the gaseous state thereof is disadvantageous. In addition, a reaction with diborane as a hydroborating agent proceeds very slowly. The hydroborating agent is preferably liquid or solid.

The compound from the group of the hydroborating agents used with preference in the process according to the invention is selected from a) a $BH_3$ complex with a complexing agent selected from the group consisting of THF; $NR_3$ where R=H, alkyl, aryl and $SR'_2$ where R'=H, alkyl, aryl; or b) a compound of the $B_xC_{xn}H_{2xn-x}$ type where x=1-4 and n=3-10, preparable by reaction of a $BH_3$ complex as defined in a) with a cyclic diene. Particularly preferred from groups a) and b) are the compounds $BH_3$*THF, $BH_3$*$SMe_2$, $BH_3$*$NMe_3$ or 9-borabicyclononane (9-BBN), 7-borabicycloheptane and/or 11-borabicycloundecane. Very particularly preferred hydroborating agents are $BH_3$*THF, $BH_3$*$NMe_3$ and 9-borabicyclononane (9-BBN).

A formulation "containing at least one silicon compound and at least one compound from the group of the hydroborating agents" is understood in the context of this invention to mean either a composition consisting of at least one silicon compound and at least one compound from said group of hydroborating agents or a composition producible from at least one silicon compound and at least one compound from the group of hydroborating agents, especially a reaction product of at least one silicon compound with at least one compound from said group of hydroborating agents.

The class of dopants mentioned above under a) and b) has been used to date in organic synthesis chemistry especially for the hydroboration of alkenes, in order to obtain the corresponding anti-Markovnikov product in the subsequent hydroxylation. It is therefore especially surprising that this class of compounds can find use for the doping of Si layers for optoelectronic components. They are commercially available and storage-stable. In most cases they are nontoxic and do not exhibit cluster formation, which complicates homogeneous distribution of the dopant atom in the Si layer.

The process according to the invention has several advantages. For instance, shorter times leading to the doped p layers can be achieved in step d). This might be because the doping element is released more readily than from compounds which are used in the prior art. The radical which forms when the doping element is released is also stable and readily evaporable. A further advantage is that nontoxic commercially available substances can be used. Surprisingly, with the new class of dopants, moreover, p-doped silicon layers with very good conductivity become available.

The silicon compound used with preference in the process according to the invention is a silicon-hydrogen compound, preferably of the general formula $Si_nH_{2n+2}$ or $Si_nH_{2n}$ where n=3 to 20; a silicon halide; a silicon organyl; an oligomeric silicon compound $Si_nR_{2n+2}$ or $Si_nR_{2n}$ where n=8 to 100 and R=H, halogen, organyl, where each R may be selected independently; or any mixture of such silicon compounds. In addition, the compounds mentioned, especially the silicon-hydrogen compounds of the general formula $Si_nH_{2n+2}$ or $Si_nH_{2n}$ where n=3 to 20, before they are used in step b), are partly or wholly oligomerized, it being possible to establish molar masses of 330 g/mol to 10 000 g/mol, preferably 400 g/mol to 3000 g/mol, more preferably 500 g/mol to 1000 g/mol. The oligomerization can be effected partly or wholly by irradiation or thermal treatment.

Particular preference is given to using silicon-hydrogen compounds, i.e. silanes and oligo- or polysilanes, since these are obtainable by chemical syntheses or catalytic fusion of $SiH_4$ and have a high silicon content based on the molar mass of the compounds. Particularly suitable silanes for the process according to the invention are those of the general formula $Si_nH_{2n+2}$ where n=3 to 10, preferably n=4 to 8, or $Si_nH_{2n}$ where n=4 to 8, preferably n=5 and 6.

The oligomeric silicon compound $Si_nR_{2n+2}$ or $Si_nR_{2n}$ where n=8 to 100 and R=H can be prepared, for example, by oligomerization of one or more silicon compounds of the general formula $Si_nH_{2n+2}$ or $Si_nH_{2n}$ where n=3 to 20. The oligomeric silicon compound $Si_nR_{2n+2}$ or $Si_nR_{2n}$ where in each case n=8 to 100 and R=halogen can be prepared, for example, by oligomerization of one or more silicon halides. Finally, the oligomeric silicon compound $Si_nR_{2n+2}$ or $Si_nR_{2n}$ where in each case n=8 to 100 and R=organyl can be prepared by oligomerization of one or more silicon organyls. In all cases, each abovementioned R can be selected independently.

In one variant of the process according to the invention, the silicon-containing formulation can be prepared by oligomerizing and/or polymerizing a mixture containing at least one higher silane of the general formula $Si_nH_{2n+2}$ where n=3 to 10, preferably n=4 to 8, or $Si_nH_{2n}$ where n=4 to 8, preferably n=5 and 6. For oligomerization by means of UV irradiation or heat treatment, higher silanes of the aforementioned formulae where n≥3 are used. In this way, a desired higher-viscosity liquid mixture containing oligo-/polysilanes can be prepared in one step from a liquid low-viscosity mixture.

In a further variant of the process according to the invention, the silicon-containing formulation can be prepared by oligomerizing and/or polymerizing a mixture containing at least one silicon compound and at least one dopant from the group of the hydroborating reagents by means of an energetic processes, for example UV irradiation, thermal treatment (co-oligomerization). The compound from the group of the hydroborating agents can thus be added before or after or else during any oligomerization and/or polymerization of the silicon compound undertaken.

The silicon-containing formulation used in the processes according to the invention is typically a liquid formulation. This consists of the aforementioned silicon compounds, optionally in a mixture with solvents. Solvents usable with preference are those from the group consisting of linear, branched or cyclic saturated, unsaturated or aromatic hydrocarbons having one to 12 carbon atoms (optionally partially or fully halogenated), alcohols, ethers, carboxylic acids, esters, nitriles, amines, amides, sulphoxides and water. Particular preference is given to n-pentane, n-hexane, n-heptane, n-octane, n-decane, dodecane, cyclohexane, cyclooctane, cyclodecane, dicyclopentane, benzene, toluene, m-xylene, p-xylene, mesitylene, indane, indene, tetrahydronaphthalene, decahydronaphthalene, diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, p-dioxane, acetonitrile, dimethylformamide, dimethyl sulphoxide, dichloromethane and chloroform.

Solvents with particularly good usability are the hydrocarbons n-pentane, n-hexane, n-hepane, n-octane, n-decane, dodecane, cyclohexane, cyclooctane, cyclodecane, benzene, toluene, m-xylene, p-xylene, mesitylene, indane and indene.

If appropriate, further solvent(s), further dopant(s) and/or further assistant(s) can additionally be added. In this case, these further agents or substances can each independently be added to the mixture actually before the oligomerization and/or polymerization or only thereafter. In this case too, the oligomerization and/or polymerization can be effected partly or wholly by irradiation or thermal treatment, it being possible to establish molar masses of 330 g/mol to 10 000 g/mol, preferably 400 g/mol to 3000 g/mol, more preferably 500 g/mol to 1000 g/mol. The proportion of solvent based on the overall formulation may be 5 to 99% by weight, preferably 25 to 85% by weight, more preferably 50 to 85% by weight.

The substrate can be coated with the silicon-containing formulation in a known manner. Preference is given to depositing the formulation by means of a process selected from printing or coating processes (especially flexographic/gravure printing, inkjet printing, offset printing, digital offset printing and screen printing), spraying processes, rotary coating processes ("spin-coating"), dipping processes ("dip-coating") and processes selected from meniscus coating, slit coating, slot-die coating and curtain coating.

The thermal treatment of the coated substrate can be effected in a known manner, especially with substantial exclusion of $O_2$ and $H_2O$. For instance, the substrate coated with the formulation can be heated to temperatures of 200 to 1000° C., preferably 250 to 700° C., more preferably 300 to 650° C. This forms, in accordance with the invention, an at least partly converted layer consisting predominantly of silicon. In the case of freshly produced layers, it is also possible to use a UV lamp (e.g. wavelength 254 nm or wavelength 180 nm) to effect upstream curing by crosslinking. In a preferred embodiment of the process according to the invention, the coated substrate is sent to a thermal treatment without irradiation. In principle, the heat treatment can be effected by the use of ovens, heated rollers, hotplates, infrared radiation or microwave radiation or the like. Particular preference is given to performing the heat treatment, however, with a hotplate or with heated rollers in a roll-to-roll process due to the low complexity which then results.

The temperatures range from 200° C. to 1000° C. The layers can also be aftertreated by heating under forming gas mixtures of hydrogen and nitrogen or of hydrogen and argon (e.g. $H_2/N_2$ in a volume ratio of 5/95 to 10/90 or $H_2/Ar$ in a volume ratio of 5/95 to 10/90) at temperatures of 250° C. to 700° C., preferably 300° C. to 650° C.

In the thermal treatment of the coated substrate, the at least partly oligomerized film consisting predominantly of silicon is generally converted within fewer than 10 minutes, preferably fewer than 5 minutes. The conversion can take place under pressures of 200 mbar up to 50 bar. The conversion preferably takes place at pressures of 500 mbar to 10 bar, most preferably in the range from 800 mbar to 1300 mbar. The temperatures may be in the range from 250° C. to 700° C., and are preferably in the range from 300° C. to 650° C. for p-doped aSi layers. The conversion can take place in one or more successive thermal steps.

As a result of longer conversion times, the layers which form lose more hydrogen, which saturates defects sites, called dangling bonds. These defects sites may constitute traps for the dopant charge carriers and hence cause poorer doping efficiencies. Longer conversion times as described in the prior art are additionally disadvantageous since they result in higher process costs due to longer coating lines.

As mentioned above, the process according to the invention is suitable for production of "at least one" silicon layer arranged on a substrate. In order to obtain several corresponding silicon layers on a substrate, process steps (b) to (d) can be performed more than once. In the case of several passes through the process steps, the individual layers can independently be configured specifically, such that the properties of each layer can be adjusted individually for the intended purpose.

For the process according to the invention, a multitude of substrates can be used. Preference is given to substrates consisting of glass, quartz glass, graphite, metal, silicon, or consisting of a silicon, indium tin oxide, $ZnO:F$ or $SnO_2:F$ layer on a heat-compatible carrier.

Preferred metals are aluminium, stainless steel, Cr steel, titanium, chromium or molybdenum. In addition, it is possible to use polymer films, for example of PEN, PET or polyimides.

However, the substrate used may also be a coated substrate which has already been produced by the process described here.

The present invention also provides a coated substrate comprising a substrate and a p-doped silicon layer, characterized in that the p-doping is a boron doping, the boron being introduced by a compound from the group of the hydroborating agents, as described above.

The abovementioned coated substrates can preferably be produced by the process according to the invention described here.

Useful substrates include all abovementioned materials and arrangements, especially those which are electrically conductive or which have an electrically conductive surface.

The present invention further provides a photovoltaic unit, especially a solar cell or solar cell combinations, which has been produced or can be produced using the process according to the invention described here or variants thereof.

The present invention also comprises, more particularly, the use of a compound from the group of the hydroborating agents for p-doping of a silicon layer, specifically those silicon layers which are produced by a process comprising the steps of applying a formulation containing at least one silicon compound and irradiating and/or thermally treating the coated substrate to form a p-doped layer consisting predominantly of silicon.

EXAMPLES

The layer thicknesses reported were measured with a SENpro ellipsometer, from Sentech, Berlin. The electrical measurements specified were conducted in a glovebox with an $N_2$ atmosphere which has an oxygen concentration below 1 ppm and a water content of at most 1 ppm, with a Keithley instrument.

Example 1

Production of an Si Layer p-Doped with a Hydroborating Agent ($BH_3$*THF)

In a glovebox with an $N_2$ atmosphere having an oxygen concentration below 1 ppm and a water content of at most 1 ppm, 3 ml of cyclopentasilane are admixed with 3 ml of toluene and 0.5 ml of $BH_3$*THF complex, and irradiated in an open vessel with a UV lamp of wavelength 254 nm for a period of 150 min. In the course of this, the mobile silane becomes thicker (formulation 1).

Four drops of formulation 2 composed of 0.2 ml of formulation 1 and 0.9 ml of cyclooctane are applied to a glass slide of size 2.5 cm×2.5 cm and distributed homogeneously on the glass slide at 6000 rpm with the aid of a spin-coater. Subsequently, with the aid of a hotplate, the film is heated at 500° C. for a duration of 1 min. This forms a dark, essentially oxygen-free, p-doped silicon layer on the substrate. The layer thickness is 134 nm. Conductivity measurements give a specific dark resistivity of 2×10E+05 ohmcm.

Example 2

Production of an Si Layer p-Doped with 9-borabicyclononane

In a glovebox with an $N_2$ atmosphere having an oxygen concentration below 1 ppm and a water content of at most 1 ppm, 4 ml of cyclopentasilane are admixed with 4 ml of cyclooctane and irradiated in an open vessel with a UV lamp of wavelength 254 nm for a duration of 160 min. In the course of this, the mobile silane thickens (formulation 3).

Four drops of formulation 4 composed of 0.075 ml of formulation 3, 0.141 ml of cyclooctane, 0.103 ml of toluene and 0.056 ml of cyclopentasilane are admixed with 9 mg of 9-BBN and are applied to a glass slide of size 2.5 cm×2.5 cm and distributed homogeneously on the glass slide at 3000 rpm with the aid of a spin-coater. Subsequently, with the aid of a hotplate, the film is heated at 500° C. for a duration of 1 min. This forms a dark, essentially oxygen-free, p-doped silicon layer on the substrate. The layer thickness is 149 nm. Conductivity measurements give a specific dark resistivity of approx. 7×10E+04 ohmcm.

Example 3 (Comparative)

Production of an Si Layer p-Doped with Decaborane

In a glovebox with an $N_2$ atmosphere having an oxygen concentration below 1 ppm and a water content of at most 1 ppm, 1.7 g of a 1:1 mixture of cyclopentasilane in toluene are admixed with 0.05 g of decaborane and irradiated in an open vessel with a UV lamp of wavelength 254 nm for a period of 90 min. In the course of this, the mobile silane becomes thicker (formulation 5). In addition, 2.5 ml of cyclopentasilane are irradiated alone for 55 min. In the course of this, the cyclopentasilane oligomerizes to give a viscous oligomer. 0.2 ml of this viscous oligomer is mixed with 0.05 ml of formulation 5 and 0.5 ml of toluene (formulation 6).

Four drops of formulation 6 are applied to glass slide of size 2.5 cm×2.5 cm and distributed homogeneously on the glass slide at 3000 rpm with the aid of a spin-coater. Subsequently, with the aid of a hotplate, the film is heated at 500° C. for a duration of 1 min. This results in a dark, essentially oxygen-free, p-doped silicon layer on the substrate. The layer thickness is 173 nm. Conductivity measurements give a specific dark resistivity of 2.6×10E+09 ohmcm.

The invention claimed is:

1. A process for producing a p-doped silicon layer arranged on a substrate, the process comprising:
   (a) applying a formulation to a substrate to obtain a coated substrate, wherein the formulation comprises:
   a silicon compound, and
   a $BH_3$ complex comprising $BH_3$ and a complexing agent selected from the group consisting of THF; $NR_3$ wherein R=H, alkyl, or aryl; and $SR'_2$ wherein R'=H, alkyl, or aryl,
   wherein the silicon compound and the $BH_3$ complex are separate components in the formulation,
   and
   (b) irradiating, thermally treating, or both irradiating and thermally treating the coated substrate to form a p-doped silicon layer.

2. The process according to claim 1, wherein the silicon compound is
   a silicon-hydrogen compound;
   a silicon halide;
   a silicon organyl;
   an oligomeric silicon compound $Si_nR_{2n+2}$ or $Si_nR_{2n}$, wherein n=8 to 100 and each R is independently selected from the group consisting of H, a halogen, and an organyl; or
   any mixture thereof.

3. The process according to claim 2, wherein
   the silicon compound is a partly or wholly oligomerized silicon compound, and
   a molar mass of the oligomerized silicon compound is from 330 g/mol to 10 000 g/mol.

4. The process according to claim 1, wherein the formulation further comprises a solvent.

5. The process according to claim 1, wherein the substrate is coated by flexographic/gravure printing, inkjet printing, offset printing, digital offset printing, screen printing, a spraying process, a rotary coating process, a dipping process, or a process selected from the group consisting of a meniscus coating, a slit coating, a slot-die coating and a curtain coating.

6. The process according to claim 1, wherein the thermally treating is performed at a temperature of from 200 to 1000° C.

7. The process according to claim 1, wherein the applying and the irradiating, thermally treating or both are performed more than once.

8. The process according to claim 1, wherein the substrate is electrically conductive or comprises an electrically conductive surface.

9. The coated substrate produced by the process according to claim 1.

10. A photovoltaic unit produced by the process according to claim 1.

11. A p-doped silicon layer produced by the process according to claim 1.

12. The process according to claim 1, wherein the silicon compound is a silicon-hydrogen compound of a general formula of $Si_nH_{2n+2}$ or $Si_nH_{2n}$, wherein n=3 to 20.

13. The process according to claim 3, wherein the molar mass of the oligomerized silicon compound is from 400 g/mol to 3000 g/mol.

14. The process according to claim 3, wherein the molar mass of the oligomerized silicon compound is from 500 g/mol to 1000 g/mol.

15. The process according to claim 1, wherein the thermally treating is performed at a temperature of from 250 to 700° C.

16. The process according to claim 1, wherein the thermally treating is performed at a temperature of from 300 to 650° C.

17. The process according to claim 1, wherein:
   the silicon compound is cyclopentasilane,
   the $BH_3$ complex comprises $BH_3$ and THF, and
   the process comprises thermally treating the coated substrate to form a p-doped silicon layer.

18. The process according to claim 17, wherein a specific dark resistivity of the p-doped silicon layer is at most $2 \times 10^5$ ohm-cm.

\* \* \* \* \*